United States Patent
Nguyen et al.

(10) Patent No.: US 9,659,642 B1
(45) Date of Patent: May 23, 2017

(54) STATE CHANGE DETECTION FOR TWO-TERMINAL MEMORY DURING APPLICATION OF A STATE-CHANGING STIMULUS

(71) Applicant: Crossbar, Inc., Santa Clara, CA (US)

(72) Inventors: Sang Nguyen, Union City, CA (US); Cung Vu, San Jose, CA (US); Dzung Huu Nguyen, Fremont, CA (US); Hagop Nazarian, San Jose, CA (US); John Nguyen, Milpitas, CA (US); Tianhong Yan, Saratoga, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/983,649

(22) Filed: Dec. 30, 2015

(51) Int. Cl.
*G11C 11/00* (2006.01)
*G11C 13/00* (2006.01)

(52) U.S. Cl.
CPC ........ *G11C 13/004* (2013.01); *G11C 13/0097* (2013.01); *G11C 2013/0054* (2013.01)

(58) Field of Classification Search
None
See application file for complete search history.

(56) References Cited

U.S. PATENT DOCUMENTS

| | | | | |
|---|---|---|---|---|
| 2003/0058686 A1* | 3/2003 | Ooishi | ............... | G11C 11/16 365/171 |
| 2006/0092691 A1* | 5/2006 | Shiimoto | ........... | G11C 13/0007 365/158 |
| 2011/0228586 A1* | 9/2011 | Kawabata | ............ | G11C 13/004 365/148 |
| 2012/0033480 A1* | 2/2012 | Hosono | ............. | G11C 13/0004 365/148 |

* cited by examiner

*Primary Examiner* — Sultana Begum
(74) *Attorney, Agent, or Firm* — Amin, Turocy & Watson, LLP

(57) ABSTRACT

A detection circuit that can detect a two-terminal memory cell changing state. For example, in response to electrical stimuli, a memory cell will change state (e.g., to a highest resistance state), but existing techniques do not detect this state change until after the stimuli is completed and a subsequent sensing operation (e.g., read pulse) is performed. The detection circuit can detect the state change during application of the electrical stimuli that causes the state change.

20 Claims, 11 Drawing Sheets

STATE CHANGE DETECTION FOR TWO-TERMINAL MEMORY DURING APPLICATION OF A STATE-CHANGING STIMULUS

TECHNICAL FIELD

This disclosure generally relates to techniques for detecting a state change of a two-terminal memory cell, and more specifically to detecting state changes (e.g., that the cell has been erased) in response to an electrical stimuli while the stimuli is being applied.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for a detection circuit that can detect a state change of a two-terminal memory cell (TTMC) or two-terminal memory device. The detection circuit can comprise a first element (e.g., an operational amplifier) and a second element (e.g., a transistor). The first element can comprise a first input coupled to a source that is activated to bias a bitline of the TTMC and a second input coupled to a feedback loop. The feedback loop can be coupled to the bitline via a local line. The first element can further comprise a first output coupled to a third input via a gate line that comprises a portion of the feedback loop. The third input can be included in the second element. The second element can further comprise a fourth input coupled to a reference source and a second output coupled to another portion of the feedback loop. In operation, a gate voltage associated with the gate line and/or the first output is inversely proportional to a cell current characterized by a current through the TTMC.

In some embodiments, the detection circuit can comprise a reference current circuit that provides a reference current. In some embodiments, the detection circuit can comprise a configurable global reference circuit. The configurable global reference circuit can comprise a comparator element that compares a configurable state reference voltage to the gate voltage. In some embodiments, the comparison can activate an inhibition signal that inhibits application of the electrical stimuli to the TTMC.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
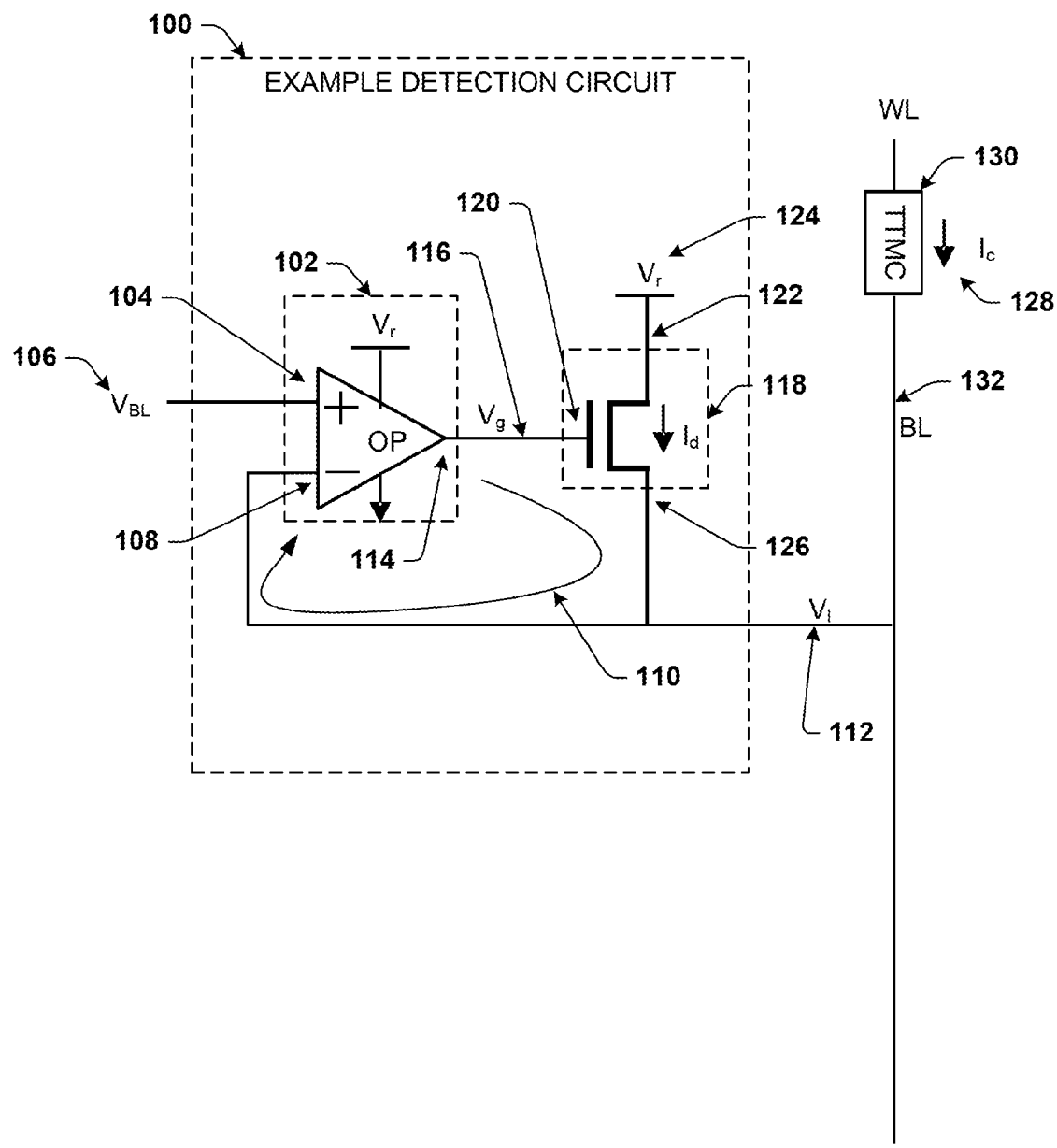
FIG. 1 illustrates a block diagram of an example detection circuit representing a first detection circuit embodiment that can detect a state change of a two-terminal memory device in accordance with certain embodiments of this disclosure.

As used herein by convention, an "erased" memory cell is one that is in a highest resistive state (e.g., an off-state), which is contrasted with a lowest resistive state (e.g., an on-state). For single-level cell (SLC) memory in which a single cell represents one bit of information, the highest resistive state and the lowest resistive state can be logically mapped to binary values such as, e.g., "1" and "0". For multi-level cell (MLC) memory in which a single memory cell can represent multiple bits of information, and in this example four-bit MLC, the highest resistive state and the lowest resistive state can be logically mapped to binary values such as, e.g., "1111" and "0000" with the intervening binary values representing other measurably distinct states of the memory cell. It is understood that conventions used herein associated with the state of the cell or associated logical binary mapping are not intended to be limiting, as other conventions, including an opposite convention can be employed in connection with the disclosed subject matter. To simplify explanation, techniques detailed herein are described and illustrated in connection with SLC memory, but it is understood that the disclosed techniques can also be utilized for MLC memory. The disclosed techniques are also generally illustrated in connection with an erase operation, although in some implementations, the disclosed techniques can apply as well to other operations such as program operations.

Conventional memory devices typically have a large number of individual memory cells coupled to a shared wordline. In embodiments in which the memory cells are individually addressable, each memory cell is coupled to a bitline that is not shared by any other cell on the wordline. To perform some state-changing operation (e.g., program, erase, etc.) on all or some subset of these memory cells, an electrical stimulus (e.g., a program pulse or erase pulse, etc.) is asserted on the shared wordline. Generally, this electrical stimulus affects only those memory cells on the wordline for which the associated bitline is appropriately configured or selected. Hence, application of a suitable stimulus to the wordline in combination with another suitable stimulus applied to one or more bitlines (e.g., a voltage bias or ground) can change the state of any or all of the memory cells on that wordline. For example, an erase stimulus (e.g., a suitable erase voltage bias) applied to the wordline can cause each memory cell with an appropriately configured and/or selected bitline to be "erased," while not affecting other memory cells (e.g., those unselected bitlines).

Generally, stimuli to be applied to the wordline and bitlines are calculated in advance to match the specification of the memory cells. If every memory cell attached to a wordline is structurally identical, then a given stimulus applied uniformly to the wordline will uniformly affect all selected cells. However, due to manufacturing defects, wear and tear, and numerous other factors, memory cells in the real world do not respond identically to the same stimuli. For example, a cell that is perfectly fabricated according to specification may be known to transition from the on-state to the off-state in response to a standard erase pulse that biases the wordline with a precise voltage magnitude applied for a precise duration. Yet, a second memory cell on the wordline may require a higher voltage magnitude or longer duration than the standard erase pulse in order to complete the erase operation. A third memory cell on the wordline may become erased in response to a smaller voltage magnitude and/or shorter duration than the standard erase pulse and therefore is more likely to be damaged by the standard erase pulse.

Thus, consider a conventional operation that is intended to erase all the memory cells on a particular wordline. Since a single wordline may serve thousands of memory cells, all with slight thresholds differences, the specified stimuli applied to the wordline and bitlines will likely successfully erase only a small subset of the memory cells. In order to address this issue, conventional solutions had to overcome two distinct challenges. First, provide a way to erase those memory cells that did not successfully change state in response to the stimuli and, second, identify which cells did not change state.

Because two-terminal memory only has two terminals, conventional systems have not been able to detect electrical characteristic changes that indicate a successful state change of the memory cell while the stimuli to effect the state change are asserted. In other words, while the erase pulse was being applied, there was no known way to determine if the memory cell was successfully erased.

Hence, conventional solutions implement what is known as incremental step pulse (ISP) operations. In accordance with ISP, after completion of the initial stimuli applied to a particular memory cell that is intended to change the state of the cell, a read pulse is subsequently applied to determine if the cell did in fact change to the intended state. If the subsequent read operation indicates that the previous operation failed to set the cell to the intended state, then the program/erase pulse is repeated, albeit generally with a higher pulse (e.g., voltage) magnitude, for a longer duration, or both. In other words, if an erase pulse with a voltage magnitude, v, fails to set the memory cell to the off-state, then another erase pulse with a voltage magnitude, v+x, is asserted. In some cases, many such cycles are needed before the cell is updated to the desired state.

ISP and other similar solutions do have drawbacks. For example, a subsequent read pulse is necessary to determine the current state of a memory cell upon completion of the erase pulse. Furthermore, on average, numerous erase cycles are required to perform an erase operation on a given memory cell. Both the read pulse and the multiple erase cycles increase power consumption and cycle timing tolerances or expectations associated with operation. Moreover, even if the cell changes state near the beginning of a given erase pulse, the full pulse is still asserted on the cell. Such leads to unnecessary power consumption and can damage the memory cell.

The subject matter disclosed herein relates to a detection circuit that can detect a state change of a two-terminal memory cell such as detecting that the memory cell has transitioned from a low-resistive state to a high-resistive state. Put differently, the detection circuit can detect that a memory cell has changed state (e.g., has been erased) in response to stimuli. Advantageously, the detection circuit can detect memory state changes during application of the erase pulse rather than subsequent to the erase pulse. In this regard, many of the drawbacks associated with ISP or other conventional solutions can be mitigated. For example, the erase pulse can be immediately inhibited or terminated in response to the state change being detected, which can reduce power and prevent potential damage to the cell. As another example, the erase pulse can be configured in a simplified manner, with fewer constraints and without the expectation that the erase pulse will be unsuccessful for some cells. As still another example, only a single erase pulse is generally needed to successfully change the state of a given memory cell or many memory cells on the same wordline, regardless of the structural differences these memory cells may exhibit. In some embodiments, the detection circuit can include various reference circuits that can facilitate wide flexibility with respect to compatibility with a wide range of different memory architectures. In other words, the disclosed subject matter can be useful for many different two-terminal memory technologies or architectures and can even be configured, potentially in situ, to increase performance, endurance or other suitable characteristics.

Example Detection Circuit Embodiments

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example detection circuit 100 is depicted. Detection circuit 100 is intended to represent a first detection circuit embodiment that can detect a state change of a two-terminal memory device. Various other embodiments of the disclosed detection circuit are provided supra, such as detection circuit 202 illustrated at FIG. 2, and detection circuit 402 illustrated at FIG. 4. Regardless of the particular implementation, the detection circuits disclosed herein (e.g., 100, 202, 402) can be coupled to a bitline of a two-terminal memory cell (TTMC) and can detect a state change of the TTMC. For example, conventional memory devices update the information stored in memory via memory operations (e.g., program or erase operations) that change the state of the memory cells. Hence, a memory cell is "programmed" or "erased" by applying a suitable electrical stimuli to the cell (e.g., via a wordline and/or bitline) intended to set or change the state of the memory cell.

In a first embodiment, detection circuit 100 can comprise a first element 102 and a second element 118. In some embodiments, first element 102 can be an operational amplifier device. In some embodiments, second element 118 can be a transistor. First element 102 can comprise a first input 104 coupled to a source 106, herein denoted as $V_{BL}$. Source 106 (e.g., $V_{BL}$) can be activated to bias the bitline (e.g., bitline 132) of a TTMC (e.g., TTMC 130). Said differently, when TTMC 130 is to be set to an erased state (e.g., a highest resistance state), such is typically done by applying an erase pulse to TTMC 130. This erase pulse can, e.g., bias an associated wordline and an associated bitline. The bias applied to the wordline and the bias applied to the bitline can include floating or grounding and are referred to herein collectively as "pulse," "erase pulse," "stimuli," or "electrical stimuli." It is understood that all such references can have two portions, e.g., the stimulus portion that is applied to the worldine (e.g., 2.0 V) and the stimulus portion applied to the bitline (e.g., 0.5 V). Hence, whatever stimulus that is applied to TTMC 130 that is intended to change the state of TTMC 130 can be fed into first input 104 of first element 102.

First element 102 can also comprise second input 108. Second input 108 can be coupled to a feedback loop 110 that is coupled to bitline 132 via a local line 112. Voltage characteristics associated with local line 112 are denoted herein as $V_l$. In some embodiments, detection circuit 100 can regulate $V_l$ to be equal to or substantially equal to $V_{BL}$.

First element 102 can further comprise first output 114. First output 114 can be coupled to a third input 120 of the second element 118 via a gate line 116. Voltage characteristics associated with gate line 116 and/or first output 114 are denoted herein as $V_g$. As illustrated, gate line 116 can represent a portion of feedback loop 110.

Second element 118 can comprise third input 120 (e.g., that is coupled to first output 114 of first element 102 via gate line 116) and fourth input 122 that is coupled to reference source 124. Reference source 124 can provide a reference voltage, $V_r$ (e.g., 3.3 V), which can be fixed or variable for the remainder of this disclosure. Second element 118 can further comprise second output 126 that can be coupled to another portion of feedback loop, as illustrated.

As will be further detailed herein a current through second element 118, referred to herein as "detection current" and denoted $I_d$, can change in response to changes of a current through TTMC 130, referred to herein as "cell current" (e.g., cell current 128) and denoted $I_c$. $I_c$ will exist in response to the electrical stimuli (e.g., an erase pulse) applied to the wordline and/or bitline 132 of TTMC 130. The value or magnitude of $I_c$, however, will vary based on the state of TTMC 130. For example, consider the case in which TTMC 130 is in a lowest resistance state (or not in the highest resistance state), and receives an erase pulse intended to set TTMC 130 to the highest resistance state. Initially, $I_c$ will be high (e.g., 40 µA), since $I_c$ is in a low resistance state. However, upon transitioning to the highest resistance state (e.g., the intent of applying the erase pulse), $I_c$ quickly drops from 40 μA to some lower value, e.g., to 10 μA, 1 μA, or some other suitable value. Since various elements of the detection circuits detailed herein can maintain an inverse relationship between $I_c$ and $I_d$, when $I_c$ drops, $I_d$ increases. Furthermore, since a fixed relationship exists between $I_d$ and $V_g$, as $I_d$ increases (in response to $I_c$ decreasing), $V_g$ must also increase.

In some embodiments, the detection circuits disclosed herein can have the following properties:

$V_i = V_{BL}$;

$I_d$ is inversely proportional to $I_c$;

$V_g$ is a function of $I_d$ and inversely proportional to $I_c$;

A measure of $V_g$ can indicate TTMC 130 has changed state.

Figure 2:
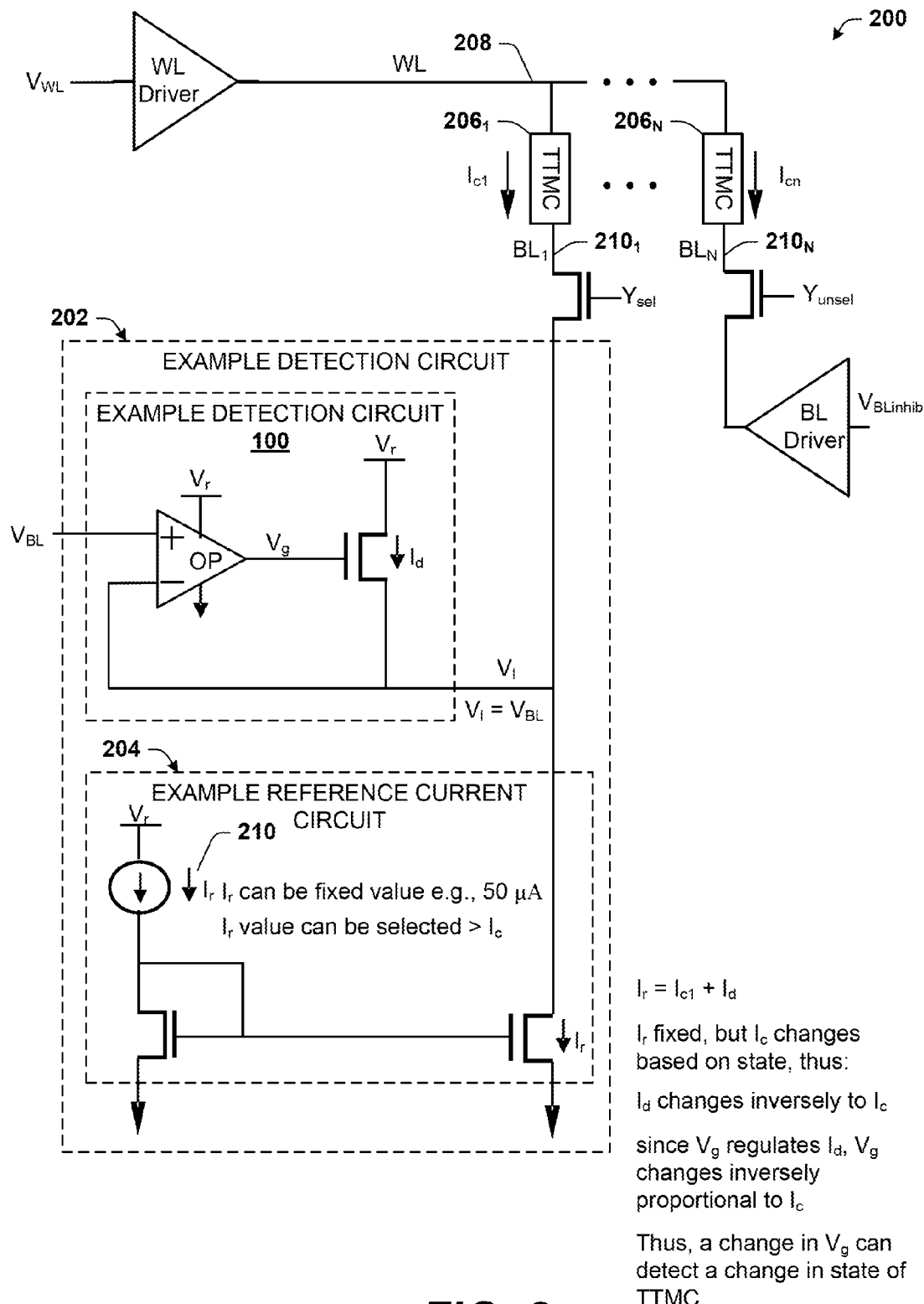
FIG. 2 depicts an example memory device that can provide a reference current used to detect a two-terminal memory changing state in response to an electrical stimulus in accordance with certain embodiments of this disclosure.

Referring now to FIG. 2, example memory device 200 is provided. Memory device 200 can provide a reference current used to detect a two-terminal memory changing state in response to an electrical stimulus. Memory device 200 can include detection circuit 202 that comprises the same or similar elements of detection circuit 100 detailed in connection with FIG. 1. Memory device 200 can further comprise a reference current circuit, an example of which is denoted by reference numeral 204.

As illustrated, memory device 200 comprises a plurality of TTMCs 206₁-206ₙ, each sharing a common wordline 208, wherein n can be a natural number greater than one. TTMCs 206₁-206ₙ are referred to herein, either individually or collectively as TTMC(s) 206, with subscripts generally used only when necessary to distinguish or better impart the disclosed subject matter. Wordline 208 receives an electrical stimulus (e.g., an erase pulse denoted $V_{WL}$) which will vary depending on the implementation and/or the characteristics of the associated TTMCs 206. In some embodiments, this electrical stimulus can be a voltage bias in a range of about 0.5 V to about 3.0 V. A typical example used herein is about 2.0 V. In this example, TTMC 206₁ is selected (e.g., by $Y_{sel}$) while TTMC 206ₙ is not selected (e.g., $Y_{unsel}$). Since TTMC 206₁ is selected, a bitline 210₁ associated with TTMC 206₁ receives an associated electrical stimulus which will also vary depending on the implementation and/or the characteristics of the associated TTMCs 206. In some embodiments, this electrical stimulus can be a voltage bias in a range of about zero volts to about 1.5 V. A typical example used herein is about 0.5 V. The electrical stimulus applied to bitline 210₁ is again denoted $V_{BL}$.

As illustrated, reference current circuit 204 provides a fixed reference current, denoted $I_r$. $I_r$ can be configured based on the specification of TTMCs 206 or based on testing measurements. In some embodiments, $I_r$ can be set to a value that is known or estimated to be greater than the cell current, $I_c$, for any TTMC 206, while in a lowest resistance state. For example, if this cell current (e.g., while in the lowest resistance state) is e.g., 40 ρA, then $I_r$ can be set to some value that is higher, such as, e.g., 50 μA.

Since $I_r$ is fixed, detection circuit 202 forces $I_d$ (e.g., detection current through second element 118) to compensate the difference between $I_r$ and $I_c$ (in this case, specifically $I_{c1}$). Hence, in this example, $I_d$ will be about 10 μA. However, at some time after the electrical stimulus is applied to TTMC 206, the cell can change state to the highest resistance state. Upon transitioning to the highest resistance state, $I_c$ is reduced. Suppose $I_c$ reduces from 40 μA to 5 μA. Since $I_r$ is fixed, the drop in $I_c$ from 40 μA to 5 μA forces $I_d$ to increase from 10 μA to 45 μA. Due to the fixed relationship between $V_g$ and $I_d$, $V_g$ sees an concomitant increase as well. By measuring or comparing Vg, detection circuits detailed herein can identify precisely when associated TTMCs 206 change state in response to stimuli, which is further detailed with reference to FIG. 3.

Figure 3:
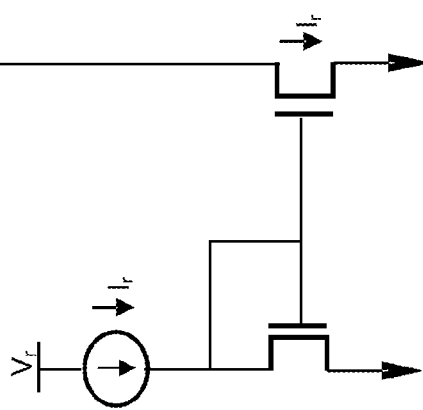
FIG. 3 depicts an example configurable global reference circuit that can provide a configurable state reference voltage in accordance with certain embodiments of this disclosure.

Turning now to FIG. 3, example configurable global reference circuit 300 is provided. Configurable global reference circuit 300 can provide a configurable state reference voltage 302, denoted $V_{config}$. $V_{config}$ can represent, for example a threshold voltage that is indicative of a state associated with TTMC 206. Configurable global reference circuit 300 can comprise a comparator device (e.g., an op-amp comparator) 304 that compares $V_g$ with $V_{config}$. An output of comparator device 304, denoted $V_{done}$, can represent this comparison. For example, $V_{done}$ can be asserted if $V_g$ is greater than $V_{config}$ and not asserted otherwise. In this regard, $V_{done}$ can go high or be asserted in response to a state change associated with TTMC 206 and can thus be utilized to signal other elements to inhibit the electrical stimulus being applied to TTMC 206. In other words, the stimulus applied to TTMC 206 can be inhibited immediately upon the effects of the stimulus being realized (e.g., TTMC 206 being set to the desired state).

Figure 4:
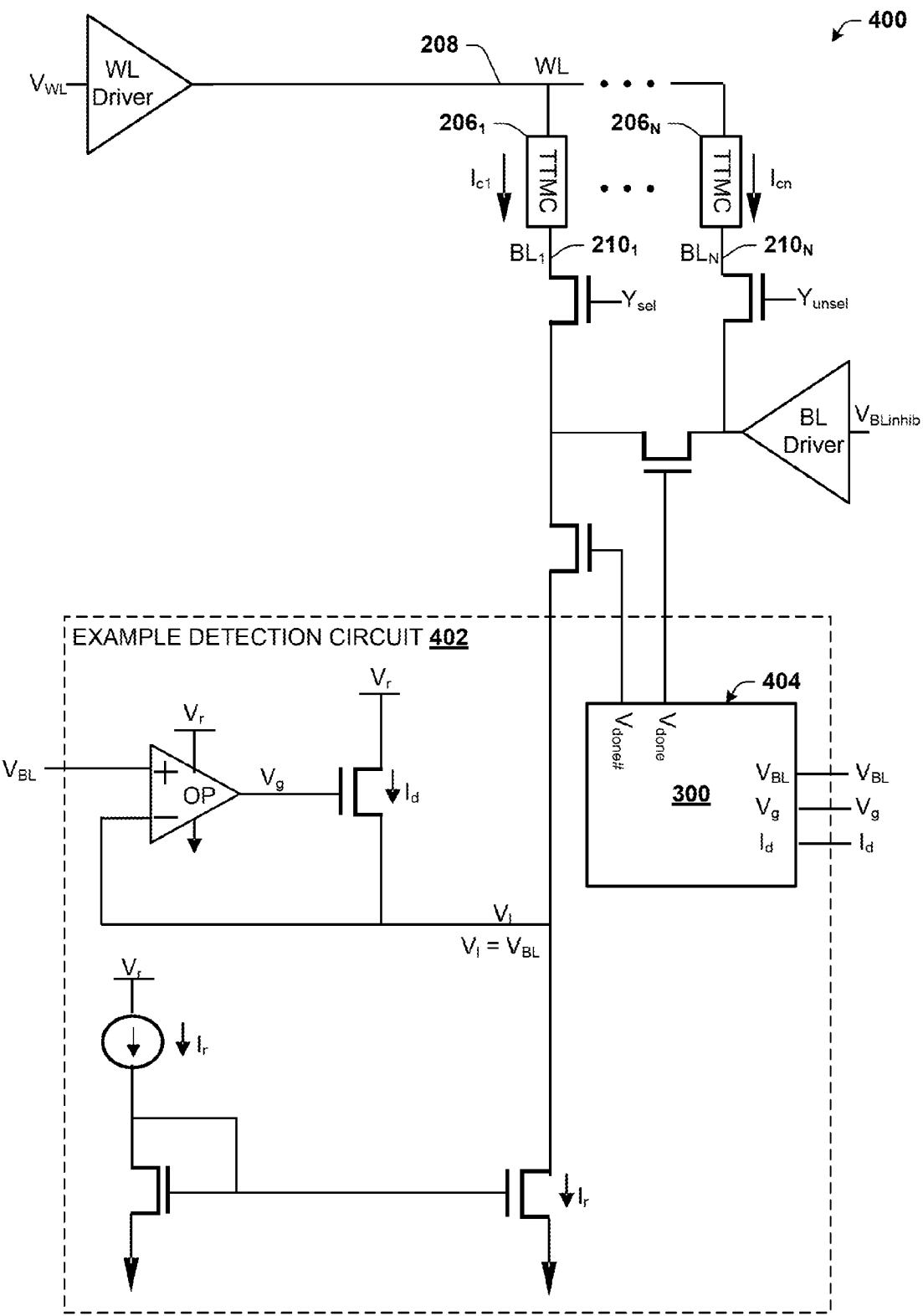
FIG. 4 depicts an example memory device that can inhibit an electrical stimulus applied to a memory cell in response to the memory cell changing state in accordance with certain embodiments of this disclosure.

FIG. 4 provides another example memory device 400 that can inhibit an electrical stimulus applied to a memory cell in response to the memory cell changing state. Memory device 400 can be substantially similar to memory device 200. In this embodiment, memory device 400 can comprise example detection circuit 402, representing yet another example embodiment of the disclosed detection circuit. Detection circuit 402 can comprise all or a portion of detection circuit 202 detailed in connection with FIG. 2. Additionally or alternatively, detection circuit 402 can comprise element 404 that can inhibit the electrical stimulus that changes the state of TTMC 206 in response to detecting TTMC 206 has changed state. Element 404 can comprise all or a portion of configurable global reference circuit 300 detailed in connection with FIG. 3.

In some embodiments, the two-terminal memory detailed herein can include an interface layer situated between a top electrode (TE) and a bottom electrode (BE). In some embodiments, TTMC 206 can be a single-level cell (SLC) characterized by two distinct measurable states. In some embodiments, TTMC 206 can be a multi-level cell (MLC) characterized by different measurable states of the TTMC 206 representing multiple bits of data. In some embodiments, TTMC 206 can be a resistive two-terminal memory cell. In some embodiments, TTMC 206 can be a non-volatile, two-terminal memory cell characterized by maintaining a particular state in the absence or substantial absence of electrical power being supplied to the memory cell.

As noted previously, TTMC 206 can be a resistive-switching memory device such as a resistive random access memory (RRAM) device. TTMC 206 may be a monolithic stack of layers and may be formed on top of an insulating substrate upon which one or more complementary metal-oxide-semiconductor (CMOS) devices have been formed. In some embodiments, the CMOS devices include control transistors/control logic, or other devices (e.g. processor, logic) that may be selectively coupled to terminal(s) of a TTMC 206 device.

The monolithic stack of layers (or another suitable arrangement) of TTMC 206 can include an active region that can be situated between a bottom terminal (e.g., one layer of the monolithic stack) and a top terminal (e.g., another layer of the monolithic stack). The active region can be created comprising a conductive contact layer (e.g. a metal layer, a silicon bearing layer, etc.), an interface layer, and an active metal layer. The interface layer can be composed of or comprise one or more engineered or controlled oxide(s), which is referred to herein as a sub-oxide. The interface layer can comprise a non-stoichiometric sub-oxide that can be a combination or mixture, possibly non-homogenous, of various silicon-based layers or elements with an aggregate chemical formula of $SiO_x$, where $0 \le X < 2$. As another example, the aggregate chemical formula can be $Si_xGe_yO_z$, where $x \ge 0$, $y \ge 0$, $z \ge 0$, $x+y \le z \le 2$ $(x+y)$. In some embodiments, the active metal layer, as a conductive metal, can double as the top terminal, which is coupled to wordline 208. In some embodiments, the conductive contact layer can double as the bottom terminal, which is coupled to bitline 210. In various embodiments, the interface layer includes multiple crystalline defects. Other examples can exist.

The active region can exhibit a plurality of stable or semi-stable resistive states, each resistive state having different electrical characteristics (e.g., resistance, conductance, etc.). Moreover, respective states of the plurality of states can be formed or activated in response to a respective voltage difference applied at the two conductive contacts. Embodiments of the subject disclosure can provide a filamentary-based memory cell. For example, in a 'programmed' or 'on' state, in response to a program voltage applied across the terminals ions are created within active metal layer 210 and are injected or driven from the active metal layer to permeate the interface layer. Once the program voltage is removed, the ions are trapped within the defects of the interface layer and become neutral metal particles. In some embodiments, the trapped metal particles form one or more conductive filament(s).

One example of a filamentary-based two-terminal memory cell can comprise: a conductive layer (e.g., comprising, e.g., TiN, TaN, TiW, metal compound) or a conductive silicon (Si) bearing layer (e.g., polysilicon, polycrystalline, SiGe, etc.); the interface layer (also referred to as a resistive switching layer or a resistive switching material layer), which in this case can comprise a silicon sub-oxide, silicon sub-nitride, metal nitride or other material having crystalline defects or defect regions (e.g., amorphous silicon, intrinsic silicon, non-stoichiometric silicon oxide); and the active metal layer for providing filament-forming particles into the interface layer.

In various examples, the active metal layer can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd), alloys of such metals, as well as materials rich in such metals, such as non-stoichiometric metal compounds, e.g. metallic nitrides. Other suitable conductive materials, as well as compounds or combinations of the foregoing can be employed for the active metal layer in some aspects. In some embodiments, an active metal layer may comprise two or more layers of materials (e.g., sub-layers), such as a layer of silver, aluminum, or the like above a thin layer of oxidizable metal, e.g. titanium. In various embodiments, particles of metal derived from the active metal layer become trapped within the defect regions of the interface layer. These trapped particles are neutral metal particles that form conductive filaments within the interface layer. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In some aspects, the two-terminal memory can comprise 20 nanometer (nm) technology, whereas in other aspects the two-terminal memory can comprise sub-20 nanometer technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on. In the case of multi-level cells (MLC), two stacked layers of cells that can represent two bits of data per cell can have an effective component area of 1.07 $F^2$, and better component area metrics can be achieved by either increasing the number of stacks or the number of bits represented by the cells.

Generally, to program one or more memory cells, a suitable program voltage can be applied across the memory cell(s) causing a conductive filament(s) or path(s) to form through a resistive portion (e.g., interface layer) of the memory cell as mentioned above. This can further cause the memory cell to switch from a relatively high resistive state, to a relatively low resistive state. An erase process can be implemented to reverse, remove, or disassociate the conductive filament(s), at least in part, causing the memory cell to return to the high resistive state from the low resistive state. By convention, herein, the relatively high resistive state is referred to as a "resistive state" or an "off-state" and the relatively low resistive state is referred to as a "conductive state" or an "on-state". This physical change of state, in the context of memory, can be associated with respective logical states of a binary bit (or of multiple bits, in the case of the conductive filament(s) being programmable to four or more distinct resistance states). Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

In some embodiments, the detection circuits disclosed herein can have the following properties:

$I_r = I_d + I_c$;
$I_r = k(V_g - V_l - V_{th})^2$, where k is a constant based on the architecture of the TTMC and $V_{th}$ represents a threshold voltage of a transistor such as second element 118;

$$V_g = \sqrt{\frac{I_d}{k}} + V_l + V_{th}.$$

With regard to resistive two-terminal memory, with an oxide representing an interface or switching layer, the constant, k, can be, e.g., $k = (\frac{1}{2}) * \mu_n * C_{ox} * (W/L)$, where $\mu_n$ relates to an electron mobility metric, $C_{ox}$ relates to an oxide thickness, and W/L represent width and length values.

Figure 5:
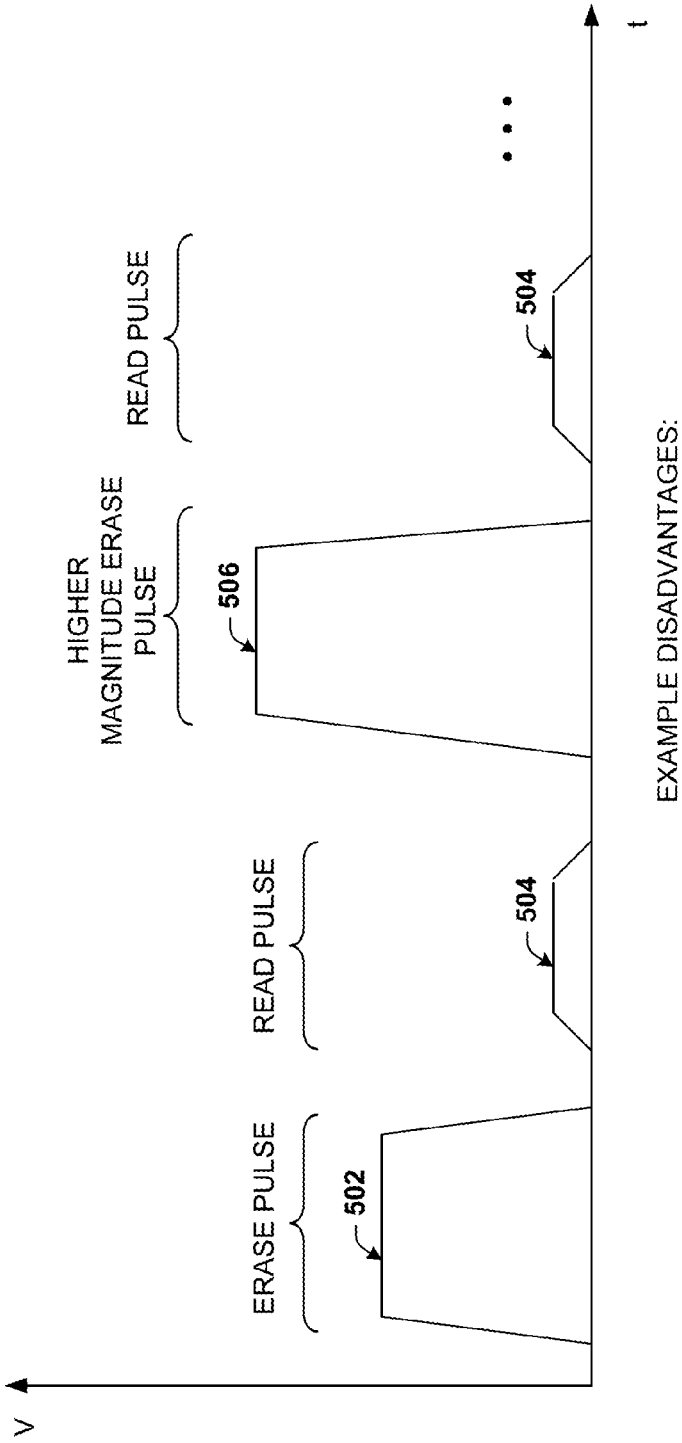
FIG. 5 depicts an example graph that plots voltage over time in connection with ISP erase pulses intended to erase a memory cell in accordance with certain embodiments of this disclosure.

Referring now to FIG. 5, graph 500 is depicted. Graph 500 plots voltage over time in connection with ISP erase pulses intended to erase a memory cell. It is understood that examples provided herein in connection with erase pulses can be correspondingly indicative of programming pulses.

In other two-terminal memory systems (e.g., those that utilize ISP), when a memory cell is intended to be programmed or erased, a specific voltage is applied to one of the terminals for defined period. Such is illustrated by erase pulse 502. In these other systems, erase pulse 502 is typically asserted at a constant voltage over a fixed period. Thereafter, a read pulse 504 is asserted and, by measuring the current through the cell during the read pulse 504, it is verified whether the cell was in fact successfully erased to the off state (e.g., low conductance/high resistance state).

If so, then ISP operation can end. If the sensing performed by read pulse 504 does not indicate the cell was successfully erased, then the ISP operation tries again. However, with subsequent erase pulses, successively higher magnitude voltages (or longer duration) are used, illustrated by erase pulse 506. ISP operates to sequentially step up the magnitude of the voltage (or duration) until the subsequent read pulse 504 confirms the cell was successfully erased or until some voltage magnitude or pulse count reaches a defined threshold and the cell is considered bad and/or incapable of changing state. It is noted that every program, erase, and read pulse consumes energy. Hence, reduces the number of pulses used to successfully program or erase a cell or reducing the energy consumed by a given pulse whether or not such results in successful program/erase operation can improve operational characteristics of memory devices 200, 400 in a variety of ways, including, e.g., improved energy efficiency, improved timing characteristics, improved cycling speed, and so forth.

With the above in mind consider the case in which erase pulse 502 is asserted on a wordline coupled to many memory cells that are to be erased. The first read pulse 502 will likely successfully set only a subset (if any) of those cells to the desired state. Accordingly, the remainder of memory cells will need to receive erase pulse 506, and so on (e.g., additional pulses not shown) until all cells are set to the desired state or deemed bad/unusable. Thus, ISP has certain disadvantages. For example, application of an erase pulse (e.g., 502) that likely will not successfully set all memory cells to a desired state, thereby requiring multiple iterations (e.g., application of pulses 506 and so on). Another disadvantage is ISP requires a subsequent read pulse to identify success/failure. Moreover, erase pulses and corresponding read pulses increase power consumption and erase cycle time and, depending on the configuration of a cell, pulses 502, 506 can cause damage to the cell since asserted for a fixed time irrespective of when the cell changes state in response to the stimuli.

Figure 6:
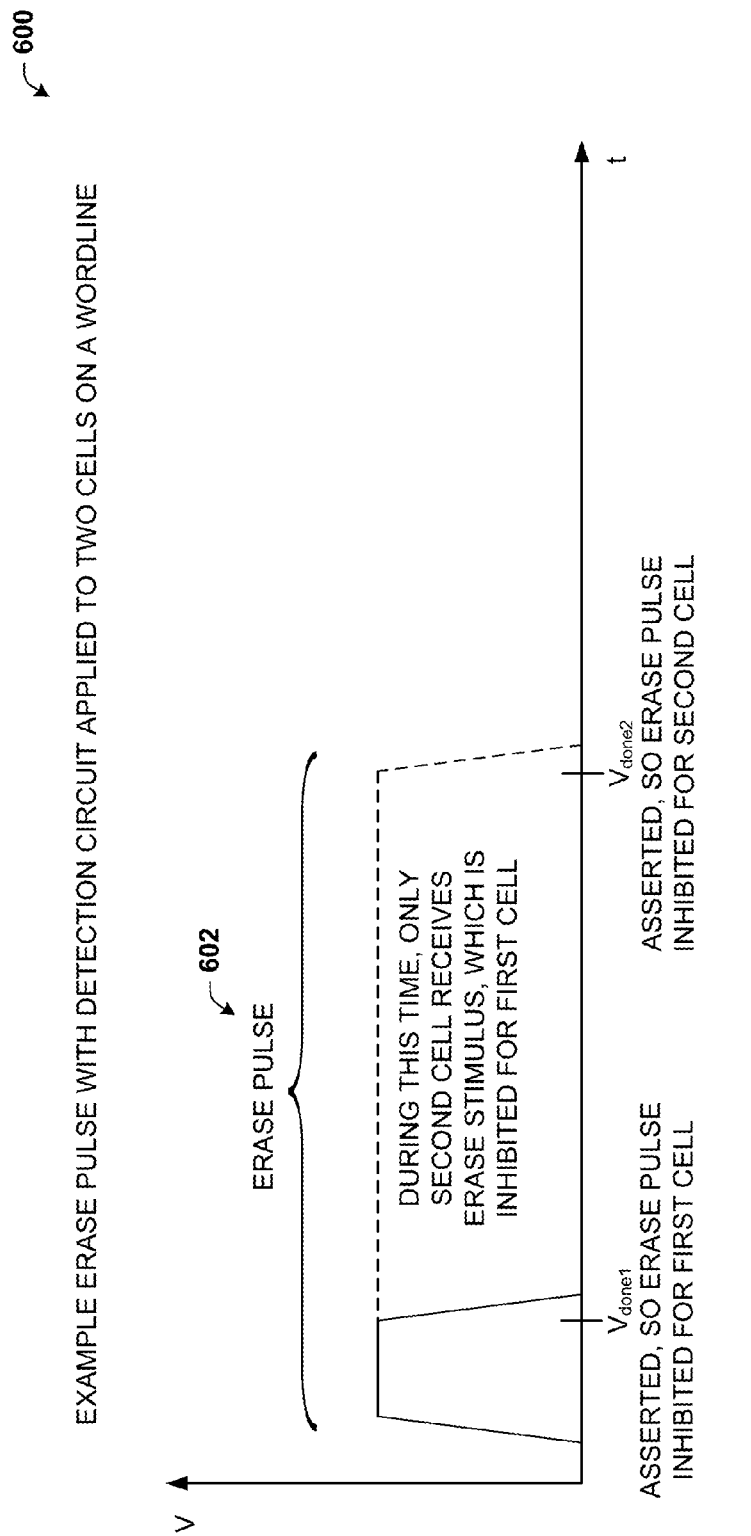
FIG. 6 depicts an example graph that plots voltage over time in connection with the disclosed techniques for applying an erase pulse intended to erase one or more memory cells in accordance with certain embodiments of this disclosure.

Turning now to FIG. 6, graph 600 is depicted. Graph 600 plots voltage over time in connection with the disclosed techniques for applying an erase pulse intended to erase one or more memory cells. In this example, erase pulse 602 is applied to erase multiple cells on the same wordline. At any time during application of erase pulse 602 any of the cells receiving erase pulse 602 can change state. As can be seen a first cell does so rather quickly, and in response $V_{done1}$ is asserted to inhibit erase pulse 602 from being applied to the first cell after that time. If the first cell is the only cell being erased, then erase pulse 602 can terminate. On the other hand, if other cells are to be erased as well, as for example, a second cell, then erase pulse 602 continues to operate on the second cell, even while no longer operating on the first cell. At some later time, when the second cell changes to the desired state, $V_{done2}$ is asserted to inhibit erase pulse 602 from being applied to the second cell.

Advantages provided in connection with the disclosed techniques can include the following examples. Read pulses, conventionally used to determine whether a previous erase pulse was successful are not needed. The erase pulse is effectively tuned to the requirements/characteristics of each cell receiving the pulse by being inhibited after a given cell changes to the desired state. The above can lead to reduced power consumption and cycle times and can prevent or mitigate damage to memory cells, thereby increasing endurance. As other advantages, thresholds associated with the erase pulse and $V_{done}$ can be highly configurable and, furthermore, the erase pulse is not constrained by certain limitations of ISP techniques, e.g., there is no need to configure the erase pulse constrained by a trade-off between likelihood of success versus likelihood of damage or the like.

Example Methods for Detecting a State Change of a Two-Terminal Memory Cell

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 7:
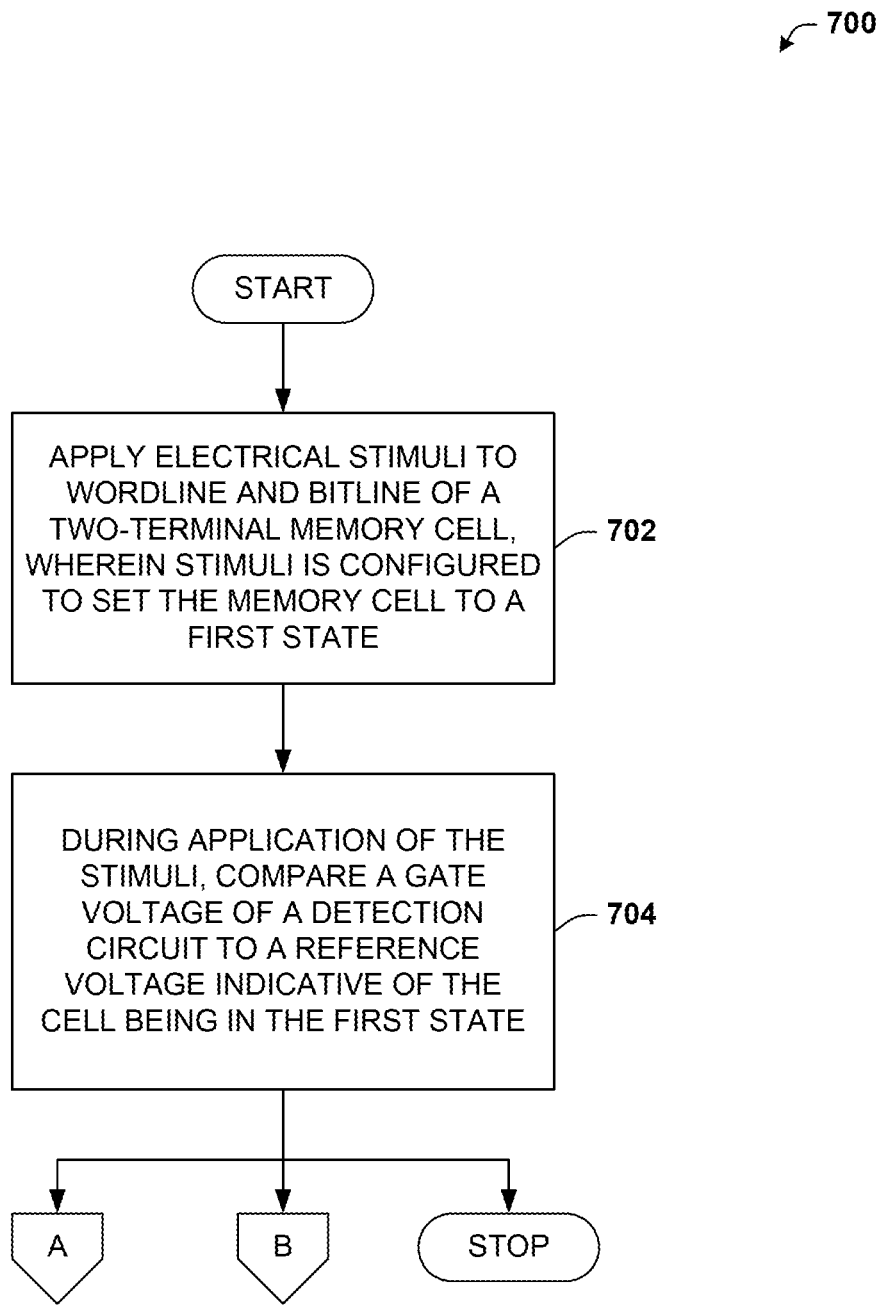
FIG. 7 illustrates an example methodology that can provide for detecting a state change during application of electrical stimuli that causes the state change in accordance with certain embodiments of this disclosure.
Figure 8:
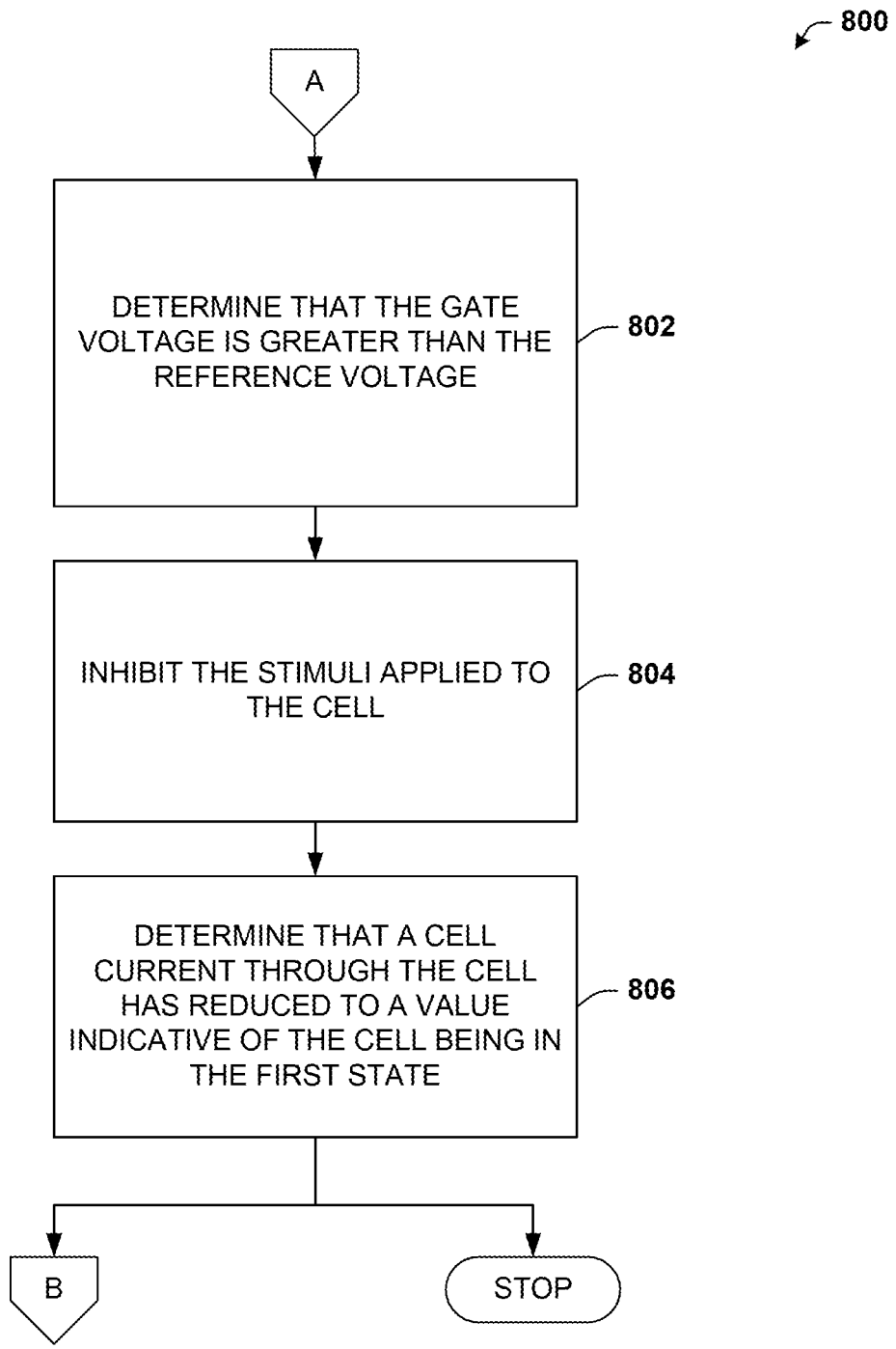
FIG. 8 illustrates an example methodology that can provide inhibiting the electrical stimuli in response criterion being satisfied in accordance with certain embodiments of this disclosure.
Figure 9:
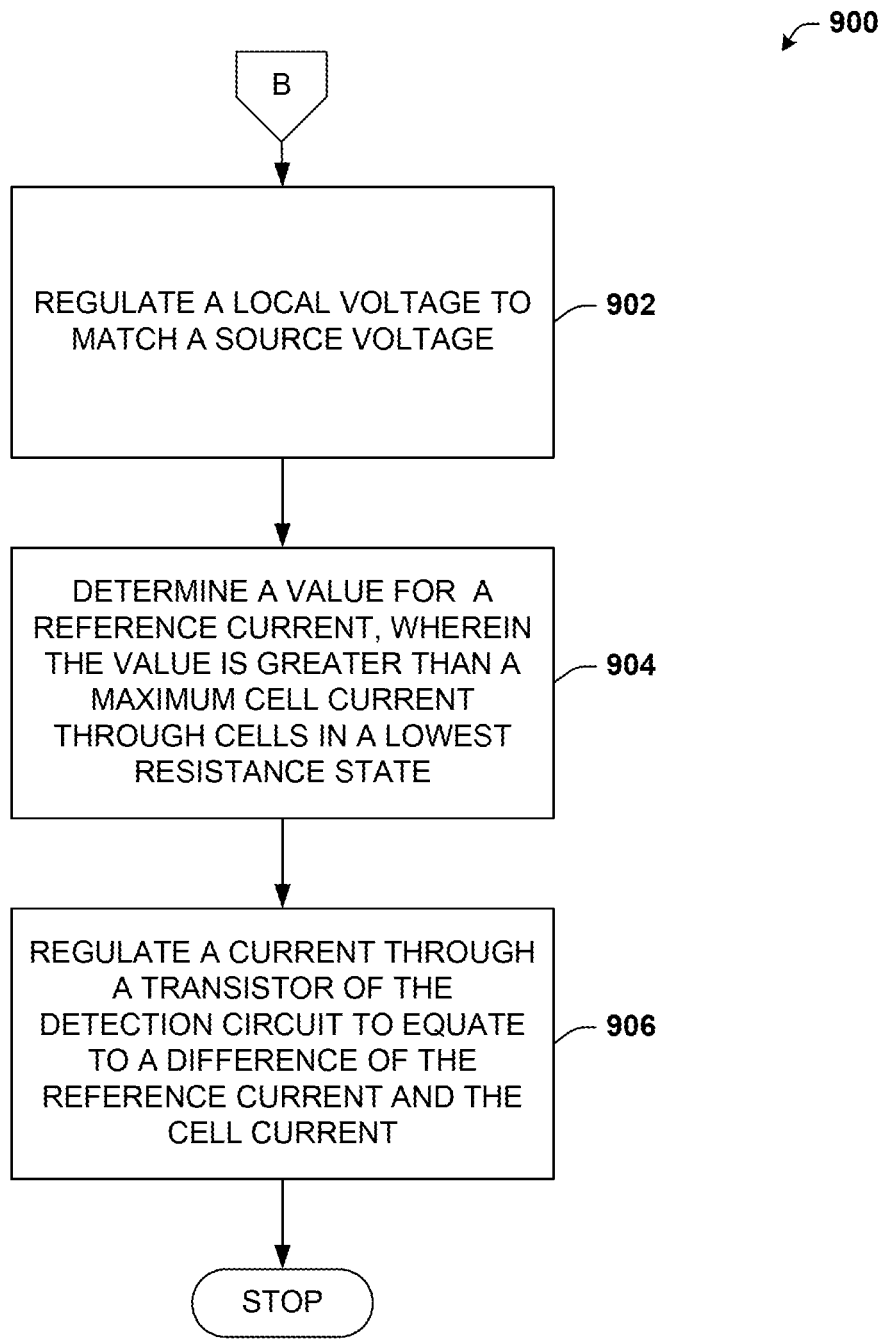
FIG. 9 illustrates an example methodology that can provide additional aspects or elements in connection with detecting a state change of a TTMC during application of the electrical stimuli in accordance with certain embodiments of this disclosure.

In view of the exemplary diagrams described supra, process methods that can be implemented in accordance with the disclosed subject matter will be better appreciated with reference to the flow charts of FIGS. 7-9. While for purposes of simplicity of explanation, the methods of FIGS. 7-9 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 7, exemplary method 700 is illustrated. Method 700 can provide for detecting a state change during application of electrical stimuli that causes the state change. It is understood that other techniques for detecting and/or verifying a state change, e.g., ISP, rely on a subsequent read pulse that is applied after the state-changing stimuli has completed. If not, further iterations of the state-changing stimuli and subsequent read pulse are applied.

At reference numeral 702, a controller of a memory device can apply electrical stimuli to a wordline and a bitline. The wordline can be coupled to a first terminal of a TTMC and the bitline can be coupled to a second terminal of the TTMC. The electrical stimuli can be configured to set the TTMC to a first state representing a binary value. For example, a voltage bias of about 2.0 V can be applied to the wordline and a voltage bias of about 0.5 V can be applied to the bitline, which can be determined to be sufficient to set the TTMC to a highest resistance state (e.g., the first state).

At reference numeral 704, the controller can compare a gate voltage (e.g., $V_g$) to a state reference voltage (e.g., $V_{config}$). The gate voltage can be indicative of a magnitude of a voltage at a gate line of a detection circuit that is coupled to the bitline via a local line. The state reference voltage can be indicative of a value or threshold associated with the TTMC being in the first state. It is understood that the comparison of the gate voltage to the state reference voltage can occur during application of the electrical stimuli. Said differently, the electrical stimuli do not need to complete a cycle before the comparison.

Turning now to FIG. 8, exemplary method 800 is illustrated. Method 800 can provide inhibiting the electrical stimuli in response criterion being satisfied. For example, the electrical stimuli can be inhibited in response to the comparison detailed in connection with reference numeral 704 of FIG. 7. For instance, at reference numeral 802, the controller can determine that that the gate voltage is greater than the state reference voltage (e.g., $V_g > V_{config}$). In response to this determination, an output of a comparator element can be asserted.

At reference numeral 804, the electrical stimuli applied to the TTMC can be inhibited. As noted, such can be in response to the comparison detailed at reference numeral 704 or a determination associated with reference numeral 802.

At reference numeral 806, the controller can determine that a cell current (e.g., $I_c$) through the TTMC has reduced to a value indicative of the TTMC being in the first state. In some embodiments, the controller can make this determination based on a determination that the gate voltage is greater than the state reference voltage.

Referring now to FIG. 9, exemplary method 900 is illustrated. Method 900 can provide additional aspects or elements in connection with detecting a state change of a TTMC during application of the electrical stimuli. For example, at reference numeral 902, the detection circuit can regulate a local voltage associated with the local line to match a source voltage representing a portion of the electrical stimuli that is associated with the bitline (e.g., the part of the electrical stimuli applied specifically to the bitline coupled to the TTMC).

At reference numeral 904, the detection circuit can provide a reference current (e.g., $I_r$) that is determined to be greater than a maximum cell current through the TTMC in a second state characterized by a lowest resistance state. It is understood that the first state can be a highest resistance state.

At reference numeral 906, the detection circuit can regulate a detection current (e.g., $I_d$) through a transistor of the detection circuit to match or equal a difference of the reference current discussed at reference numeral 904 and the cell current (e.g., $I_c$). For example, the detection circuit can regulate $I_d$ to equal $(I_r - I_c)$.

Example Operating Environments

Figure 10:
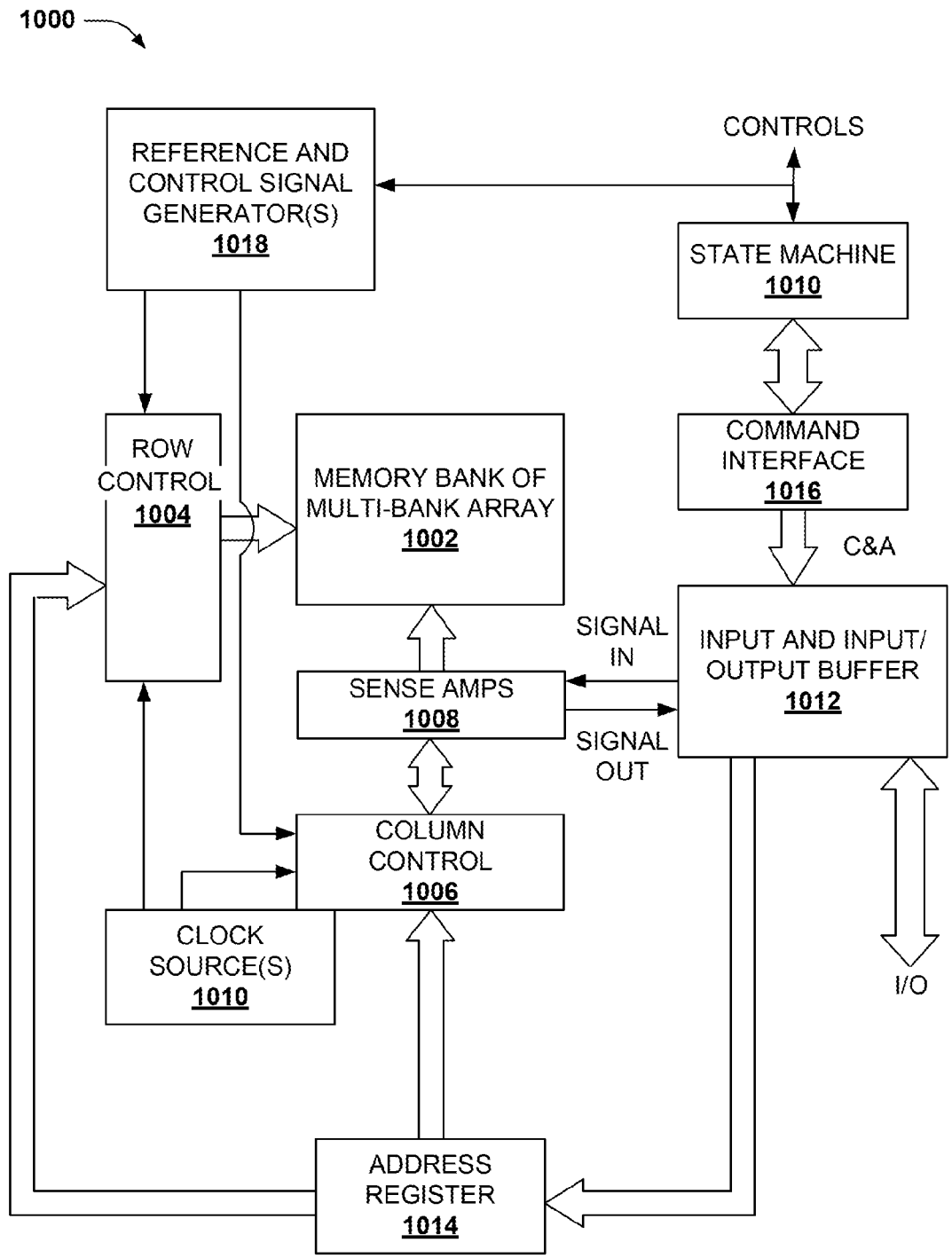
FIG. 10 illustrates a block diagram of an example electronic operating environment in accordance with certain embodiments of this disclosure.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 10 illustrates a block diagram of an example operating and control environment 1000 for a memory cell array 1002 according to aspects of the subject disclosure. In at least one aspect of the subject disclosure, memory cell array 1002 can comprise a variety of memory cell technology. Particularly, memory cell array 1002 can comprise two-terminal memory such as high density, selector-based resistive memory cells with a low-profile gate (e.g., a gate consuming a relatively small substrate surface area compared with conventional transistor gate devices), as described herein.

A column controller 1006 can be formed adjacent to memory cell array 1002. Moreover, column controller 1006 can be electrically coupled with bit lines of memory cell array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of memory cell array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1014. In addition, input data is transmitted to memory cell array 1002 via signal input lines, and output data is received from memory cell array 1002 via signal output lines. Input data can be received from the host apparatus, and output data can be delivered to the host apparatus via the I/O buffer.

Commands received from the host apparatus can be provided to a command interface 1016. Command interface 1016 can be configured to receive external control signals from the host apparatus, and determine whether data input to the input/output buffer 1012 is write data, a command, or an address. Input commands can be transferred to a state machine 1020.

State machine 1020 can be configured to manage programming and reprogramming of memory cell array 1002. State machine 1020 receives commands from the host apparatus via input/output interface 1012 and command interface 1016, and manages read, write, erase, data input, data output, and like functionality associated with memory cell array 1002. In some aspects, state machine 1020 can send and receive acknowledgments and negative acknowledgments regarding successful receipt or execution of various commands.

In an embodiment, state machine 1020 can control an analog voltage waveform generator 1018 that provides read/write and program/erase signals to row control 1004 and column control 1006.

To implement read, write, erase, input, output, etc., functionality, state machine 1020 can control clock source(s) 1010. Control of clock source(s) 1010 can cause output pulses configured to facilitate row controller 1004 and column controller 1006 implementing the particular functionality. Output pulses can be transferred to selected bit lines by column controller 1006, for instance, or word lines by row controller 1004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 11, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
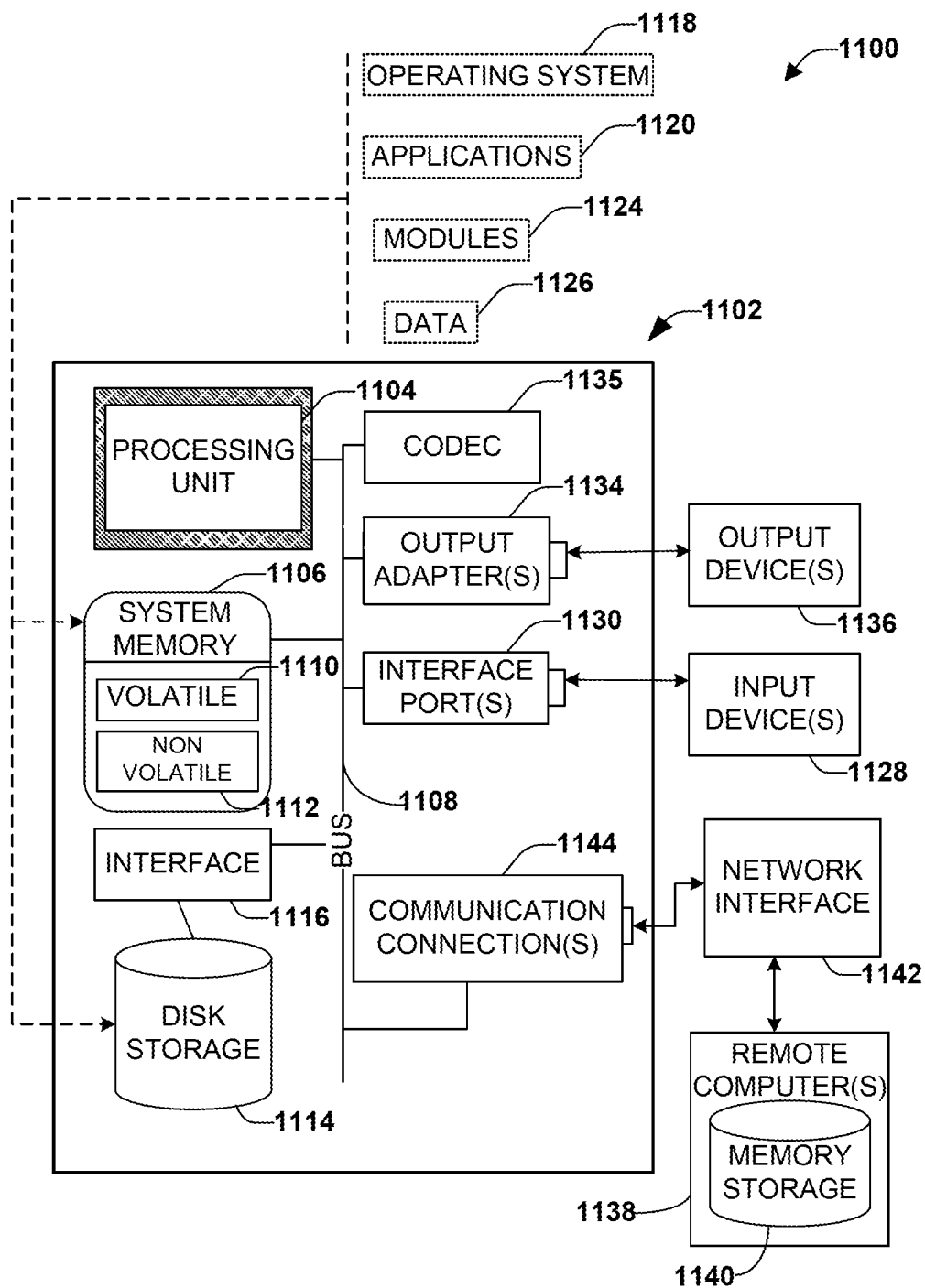
FIG. 11 illustrates a block diagram of an example computing environment in accordance with certain embodiments of this disclosure.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1194), and Small Computer Systems Interface (SCSI).

The system memory 1106 includes volatile memory 1110 and non-volatile memory 1112. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or flash memory. Volatile memory 1110 includes random access memory (RAM), which acts as external cache memory. According to present aspects, the volatile memory may store the write operation retry logic (not shown in FIG. 11) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 and/or transmitted to the server or application. The user can be provided the opportunity to opt-in or opt-out of having such information collected and/or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices and/or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A detection circuit that detects a state change of a two-terminal memory device, comprising:
   a first element comprising:
      a first input coupled to a source that is activated to bias a bitline coupled to the two-terminal memory;
      a second input coupled to the bitline via a local line; and
      a first output coupled to a third input of a second element via a gate line;
   the second element comprising:
      the third input;
      a fourth input coupled to a reference source; and
      a second output coupled to the second input via the local line,
      wherein a feedback loop comprises the gate line and the local line; and
   wherein a gate voltage, $V_g$, associated with the gate line is inversely proportional to a cell current, $I_c$, through the two-terminal memory device; and
   a reference circuit comprising a comparator element that compares a reference voltage, $V_{config}$, to $V_g$ and, in response to comparing $V_{config}$ to $V_g$, outputs a signal indicating whether the state change has occurred.

2. The detection circuit of claim 1, wherein the first element is an operational amplifier device and the second element is a transistor device.

3. The detection circuit of claim 1, wherein the state change detected by the detection circuit is indicative of an erase operation that sets the two-terminal memory device to an erase state characterized by a highest resistance state.

4. The detection circuit of claim 1, wherein the detection circuit regulates a local voltage, $V_l$, associated with the local line to match a source voltage, $V_{BL}$, provided by the source.

5. The detection circuit of claim 1, wherein the reference current circuit comprises a source element that provides a reference current, $I_r$, selected to be greater than $I_c$ when the two-terminal memory device is in a lowest resistance state.

6. The detection circuit of claim 5, wherein $I_r$ is selected to be greater than cell currents, $I_{c1}$-$I_{cn}$, representing respective currents, in respective lowest resistance states, through n different cells coupled to the wordline, wherein n is a natural number greater than one.

7. The detection circuit of claim 5, wherein $V_g$ modulates a detection current, $I_d$, through the second element.

8. The detection circuit of claim 7, wherein the detection circuit regulates $I_d$ to equal the difference of $I_r$ and $I_c$.

9. The detection circuit of claim 1, wherein $V_{config}$ is configurable in situ based on a threshold voltage associated with the state change, wherein the signal indicates the state change has occurred in response to $V_g$ being greater than $V_{config}$, and wherein the signal further indicates a bias applied to the two-terminal memory to effectuate the state change is to be terminated.

10. The detection circuit of claim 9, wherein the comparator element is an operational amplifier comparator device.

11. A memory device, comprising:
   a plurality of two-terminal memory cells, each coupled to a wordline, wherein a cell of the plurality comprises a first terminal coupled to the wordline and a second terminal coupled to a bitline; and
   a detection circuit that detects the cell transitioning to an erase state characterized by being in a highest-resistive state, the detection circuit comprising:
      an operational amplifier device, comprising:
         a first input coupled to a source that is activated to bias the bitline;
         a second input coupled to a feedback loop that is coupled to the bitline via a local line; and
         a first output coupled to a third input of a transistor device via a gate line that comprises a portion of the feedback loop;
      the transistor device, comprising:
         the third input coupled to the first output;
         a fourth input coupled to a reference source; and
         a second output coupled to another portion of the feedback loop;
      wherein a gate voltage, $V_g$, associated with the gate line is inversely proportional to $I_c$ indicative of a current through the cell; and
      a reference circuit comprising a comparator element that compares a reference voltage, $V_{config}$, to $V_g$ and, in response to comparing $V_{config}$ to $V_g$, outputs a signal indicating whether the state change has occurred.

12. The memory device of claim 11, wherein the cell changes state in response to an erase stimulus applied to the wordline or the bitline.

13. The memory device of claim 12, wherein the erase stimulus comprises a first voltage applied to the wordline and a second voltage applied to the bitline, wherein the first voltage has a magnitude in a range of between about 0.5 volts and about three volts and the second voltage has a magnitude in a range of between about zero volts and about 1.5 volts.

14. The memory device of claim 13, wherein the first voltage has a magnitude of about two volts and the second voltage has a magnitude of about 0.5 volts.

15. A method, comprising:
   applying, by a controller of a memory device, electrical stimuli to a wordline that is coupled to a first terminal of a two-terminal memory device and a bitline that is coupled to a second terminal of the two-terminal memory device, wherein the electrical stimuli are configured to set the two-terminal memory device to a first state representing a binary value;
   during application of the electrical stimuli, comparing, by the controller, a gate voltage indicative of a magnitude of a voltage at a gate line of a detection circuit that is coupled to the bitline via a local line, to a reference voltage indicative of the two-terminal memory device being in the first state; and
   determining, by the controller, based on the comparing the gate voltage to the reference voltage, whether the two-terminal memory device is in the first state.

16. The method of claim 15, wherein the determining whether the two-terminal memory device is in the first state comprises determining that a cell current through the two-terminal memory device has reduced to a value indicative of the two-terminal memory being in the first state in response to a determination that the gate voltage is greater than the reference voltage.

17. The method of claim 15, further comprising inhibiting, by the controller, the electrical stimuli in response to the controller determining that the gate voltage is greater than the reference voltage.

18. The method of claim 15, further comprising regulating, by the detection circuit, a local voltage associated with the local line to match a source voltage representing a portion of the electrical stimuli that is associated with the bitline.

19. The method of claim 15, further comprising providing a reference current that is selected to be greater than a maximum cell current through the two-terminal memory device in a second state characterized by a lowest resistance state.

20. The method of claim 19, further comprising regulating, by the detection circuit, a current through a transistor of the detection circuit to equate to a difference of the reference current and the cell current.

* * * * *